(12) United States Patent
Tsai et al.

(10) Patent No.: US 7,459,770 B2
(45) Date of Patent: Dec. 2, 2008

(54) LEAD FRAME STRUCTURE HAVING BLOCKING SURFACES AND SEMICONDUCTOR PACKAGE INTEGRATED WITH THE LEAD FRAME STRUCTURE

(75) Inventors: Wen-Shan Tsai, Taichung (TW); Chien-Feng Wei, Taichung (TW); Hung-Wen Liu, Taichung (TW); Ming Cheng Lin, Taichung (TW); Lien-Chen Chiang, Taichung (TW)

(73) Assignee: Siliconware Precision Industries Co., Ltd., Tantzu Taichung (TW)

( * ) Notice: Subject to any disclaimer, the term of this patent is extended or adjusted under 35 U.S.C. 154(b) by 54 days.

(21) Appl. No.: 11/527,674

(22) Filed: Sep. 27, 2006

(65) Prior Publication Data

US 2007/0111395 A1    May 17, 2007

(30) Foreign Application Priority Data

Sep. 29, 2005    (TW) .............................. 94133908 A

(51) Int. Cl.
*H01L 23/495* (2006.01)
*H01L 21/00* (2006.01)

(52) U.S. Cl. .............................. 257/666; 257/E23.037; 257/E23.046; 257/E21.504; 257/E21.505; 257/669; 257/670; 257/671; 257/672; 257/674; 257/695; 257/696; 257/676

(58) Field of Classification Search ................. 257/666, 257/676, 669, 670, 671, 672, 674, 695, 678, 257/696, E23.037, E21.504, E23.046
See application file for complete search history.

(56) References Cited

U.S. PATENT DOCUMENTS

| 6,677,665 | B2 * | 1/2004 | Huang ........................ 257/676 |
| 7,012,325 | B2 * | 3/2006 | Ahn et al. .................... 257/678 |
| 2002/0113305 | A1 * | 8/2002 | Huang ........................ 257/690 |
| 2002/0121680 | A1 * | 9/2002 | Ahn et al. .................... 257/666 |
| 2003/0151123 | A1 * | 8/2003 | Huschka et al. ............. 257/678 |
| 2006/0097371 | A1 * | 5/2006 | Kawasaki et al. ........... 257/678 |
| 2007/0040249 | A1 * | 2/2007 | Kajiwara et al. ............ 257/673 |
| 2007/0252247 | A1 * | 11/2007 | Kim et al. ................... 257/666 |

* cited by examiner

*Primary Examiner*—Alexander O Williams
(74) *Attorney, Agent, or Firm*—Birch, Stewart, Kolasch & Birch, LLP

(57) ABSTRACT

A lead frame structure is provided, which includes a die pad having a first mounting portion and a second mounting portion separated from the first mounting portion by a gap. The first and second mounting portions are formed with corresponding blocking surfaces bordering the gap, so as to allow a flow rate of an encapsulating resin flowing through the gap during a molding process to be reduced by the blocking surfaces, such that different portions of the encapsulating resin respectively flowing above, in and below the die pad can have substantially the same flow rate, thereby preventing bonding wires from being deformed to cause short circuit and avoiding formation of voids. A semiconductor package with the lead frame structure is also provided.

8 Claims, 7 Drawing Sheets

US 7,459,770 B2

LEAD FRAME STRUCTURE HAVING BLOCKING SURFACES AND SEMICONDUCTOR PACKAGE INTEGRATED WITH THE LEAD FRAME STRUCTURE

FIELD OF THE INVENTION

The present invention relates to lead frame structures and semiconductor packages integrated with the lead frame structures, and more particularly, to a lead frame structure having a separated die pad, and a semiconductor package integrated with the lead frame structure.

BACKGROUND OF THE INVENTION

In view of the increasing demands for electronic products that have miniaturized profiles and are capable of operating at high speeds, it is considered necessary to improve the performance and capacity of a single semiconductor package for use in a miniaturized electronic product. Accordingly, the single semiconductor package is intended to incorporate two or more semiconductor chips to form a multi-chip module with desirably reduced overall circuit size and enhanced electrical functionality.

FIG. 1 shows a multi-chip semiconductor package disclosed in U.S. Pat. No. 5,793,108. This semiconductor package comprises a lead frame 10 having a die pad 100 and a plurality of leads 101; a first chip 11 attached to the die pad 100 via an insulating tape 13, and electrically connected to inner ends of the leads 101 of the lead frame 10 by bonding wires 15; a second chip 12 attached to the first chip 11 via an insulating adhesive layer 14 in a back-to-back manner, and electrically connected to the inner ends of the leads 101 of the lead frame 10 by bonding wires 16, such that the first and second chips 11, 12 can be electrically connected to an external device (not shown) by means of the leads 101; and an encapsulant 17 for encapsulating the first chip 11, the second chip 12 and the inner ends of the leads 101 so as to prevent external moisture and contaminants from invading the first and second chips 11, 12.

The above semiconductor package however encounters a problem of having delamination between the first chip and the die pad. This is because the first chip is attached to the die pad in a surface-to-surface manner having a large contact area between the first chip and the die pad, such that mismatch in coefficient of thermal expansion (CTE) between the first chip and the die pad tends to make the first chip delaminated from the die pad under temperature variations during the packaging processes, thereby resulting in degraded reliability of the fabricated package.

Consequently, U.S. Pat. No. 6,087,715 provides a lead frame having a separated die pad in order to solve the foregoing delamination problem. This die pad is formed with at least one opening therein to divide the die pad into a plurality of mounting portions for mounting at least one semiconductor chip thereon, such that the contact area between the semiconductor chip and the die pad is reduced, and delamination between the semiconductor chip and the die pad caused by thermal stress generated from thermal treatment of the packaging processes can be avoided.

FIG. 2A is a top view of a lead frame 20 having a separated die pad 200, and FIG. 2B is a cross-sectional view of a semiconductor package integrated with the lead frame 20 shown in FIG. 2A. Referring to FIGS. 2A and 2B, the separated die pad 200 of the lead frame 20 comprises a first mounting portion 201 and a second mounting portion 202, for allowing a first chip 21 to be attached to the top side of both the first and second mounting portions 201, 202 and allowing a second chip 22 to be attached to the bottom side of both the first and second mounting portions 201, 202. The first and second chips 21, 22 are electrically connected to leads 203 of the lead frame 20 by bonding wires. And an encapsulant 29 is formed to encapsulate the first chip 21, the second chip 22, and the die pad 200. Due to the separated die pad comprising a plurality of mounting portions, the contact area between the chips and the die pad is reduced, and thus thermal stress and delamination between the chips and the die pad can be moderated.

Further in the above lead frame with the separated die pad, a gap 25 is formed between the first chip 21 and the second chip 22 after they are mounted to the die pad 200. However, during a molding process for forming the encapsulant 29, an encapsulating resin injected into a mold cavity used in the molding process may change its flow rate when contacting the above components of the semiconductor package due to various factors such as the gap size, component surface planarity and so on.

FIGS. 3A and 3B are cross-sectional views showing mold flow situations in the molding process for the semiconductor package of FIG. 2B. As shown in FIGS. 3A and 3B, since the gap 25 between the first chip 21 and the second chip 22 is bordered by relatively smooth back surfaces of the first and second chips 21, 22 and does not have bonding wires or other elements therein, the flow of the encapsulating resin is relatively less impeded in the gap 25 and thus the encapsulating resin has a higher flow rate in the gap 25 than in gaps 27, 28 that are located between the chips 21, 22 and an encapsulation mold 26 respectively. This causes the following problem.

As the encapsulating resin injected from a gate G into the encapsulation mold 26 has a higher flow rate in the gap 25 than in the gaps 27, 28, when the encapsulating resin flowing through the gap 25 to a vent V at an end of the encapsulation mold 26, it would flow backwards into the gaps 27, 28. Since the vent V is blocked by the encapsulating resin flowing through the gap 25, air in the gaps 27, 28 cannot be expelled via the vent V but is compressed by the encapsulating resin flowing into the gaps 27, 28. The compressed air would impact the bonding wires that connect the chips 21, 22 to the lead frame, making the bonding wires deformed to cause short circuit between adjacent bonding wires.

Moreover, the air not able to be expelled through the vent remains in the encapsulant and forms voids 30, which would lead to a popcorn effect during subsequent thermal treatment and reliability testing, thereby degrading the quality of the semiconductor package.

SUMMARY OF THE INVENTION

In accordance with the foregoing drawbacks in the prior art, a primary objective of the present invention is to provide a lead frame structure and a semiconductor package integrated with the lead frame structure, so as to equalize the flow rates of different portions of an encapsulating resin during a molding process.

Another objective of the present invention is to provide a lead frame structure and a semiconductor package integrated with the lead frame structure, so as to prevent bonding wires from being deformed to cause short circuit.

A further objective of the present invention is to provide a lead frame structure and a semiconductor package integrated with the lead frame structure, so as to prevent air from remaining in an encapsulant to form voids.

In order to attain the above and other objectives, the present invention proposes a lead frame structure, comprising: a die pad comprising a first mounting portion and a second mounting portion separated from the first mounting portion by a gap, for allowing at least one semiconductor chip to be attached to the first and second mounting portions; and a plurality of leads formed around the die pad; wherein each of the first and second mounting portions has a blocking surface bordering the gap, and the blocking surface of the first mounting portion corresponds to the blocking surface of the second mounting portion, so as to allow a flow rate of an encapsulating resin flowing through the gap during a molding process to be reduced by the blocking surfaces. The blocking surfaces bordering the gap between the first and second mounting portions of the die pad are shaped to taper the gap, or each comprises a plurality of concave and convex portions, so as to reduce the flow rate of the encapsulating resin flowing through the gap during the molding process.

The present invention further proposes a semiconductor package integrated with the above lead frame structure. The semiconductor package comprises: a lead frame comprising a separated die pad and a plurality of leads formed around the die pad, the die pad comprising a first mounting portion and a second mounting portion separated from the first mounting portion by a gap, wherein each of the first and second mounting portions has a blocking surface bordering the gap, and the blocking surface of the first mounting portion corresponds to the blocking surface of the second mounting portion; a first chip and a second chip, the first chip being mounted to both the first and second mounting portions and on a top surface of the die pad, and the second chip being mounted to both the first and second mounting portions and on a bottom surface of the die pad, wherein the first and second chips are electrically connected to the leads via bonding wires; and an encapsulant formed of an encapsulating resin, for encapsulating the die pad, the first chip, the second chip, and a portion of the leads, wherein a flow rate of the encapsulating resin flowing through the gap during formation of the encapsulant is reduced by the blocking surfaces.

Compared with the conventional lead frame having a separated die pad as described in the prior art, the lead frame structure and the semiconductor package integrated with the lead frame structure according to the present invention advantageously have the blocking surfaces bordering the gap between the first and second mounting portions of the die pad so as to reduce the flow rate of the encapsulating resin flowing through the gap during the molding process, such that different portions of the encapsulating resin respectively flowing through an upper region above the die pad, the gap in the die pad and a lower region below the die pad have substantially the same flow rate. This feature can prevent short circuit caused by deformation of the bonding wires and avoid voids formed in the semiconductor package.

DETAILED DESCRIPTION OF PREFERRED EMBODIMENTS

Preferred embodiments of a lead frame structure and a semiconductor package integrated with the lead frame structure as proposed in the present invention are described as follows with reference to FIGS. 4 to 9. It should be understood that the drawings only show relevant components of the present invention and the layout of components could be more complicated in practical implementation.

Figure 1:
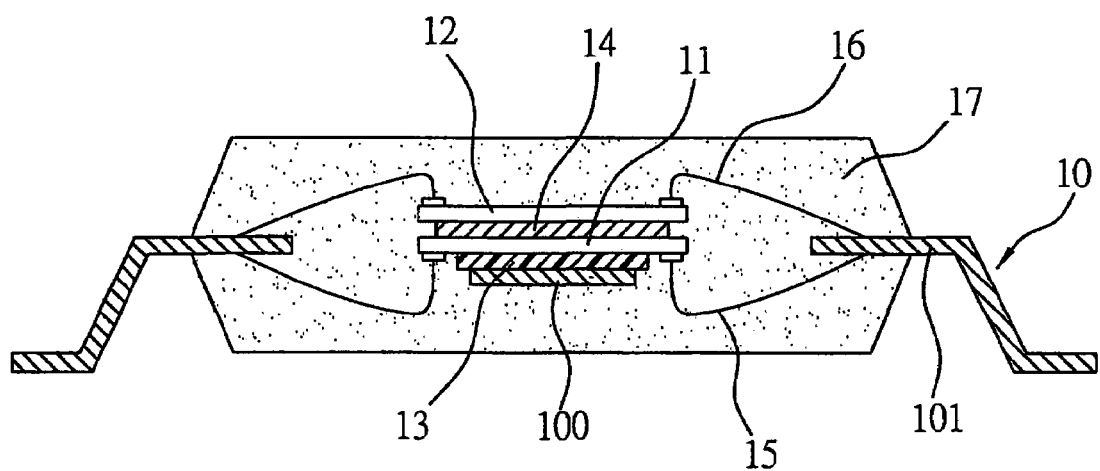
FIG. 1 (PRIOR ART) is a cross-sectional view of a multi-chip semiconductor package disclosed in U.S. Pat. No. 5,793,108.
Figure 2A:
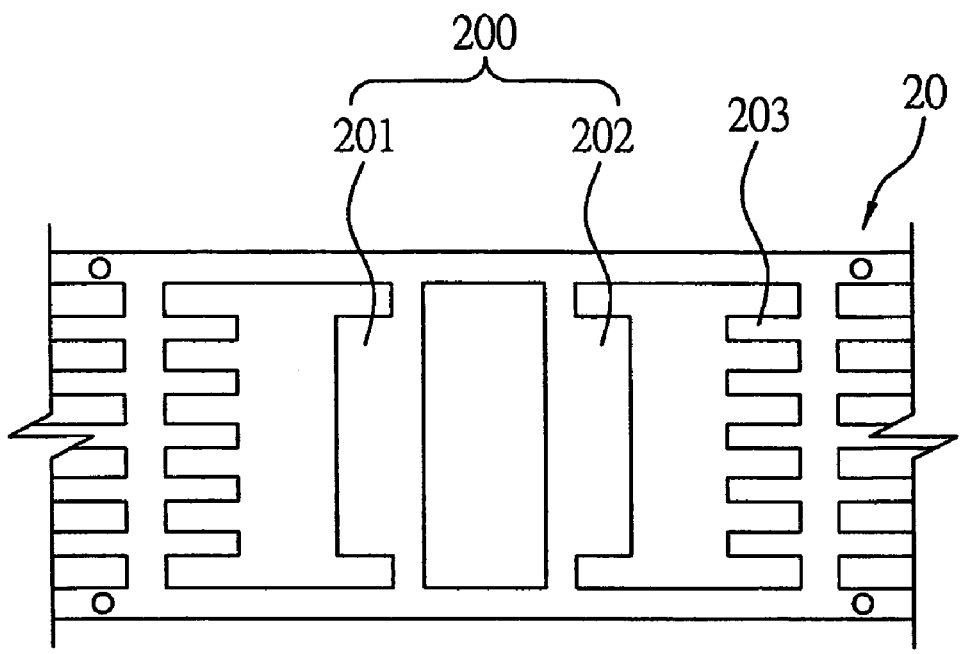
FIG. 2A (PRIOR ART) is a top view of a conventional lead frame having a separated die pad.
Figure 2B:
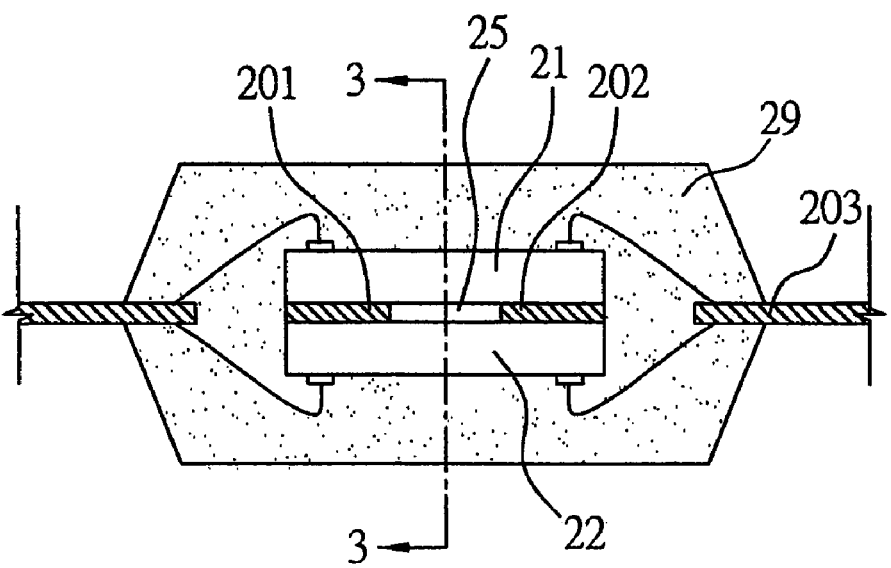
FIG. 2B (PRIOR ART) is a cross-sectional view of a conventional semiconductor package integrated with the lead frame shown in FIG. 2A.
Figure 3A:
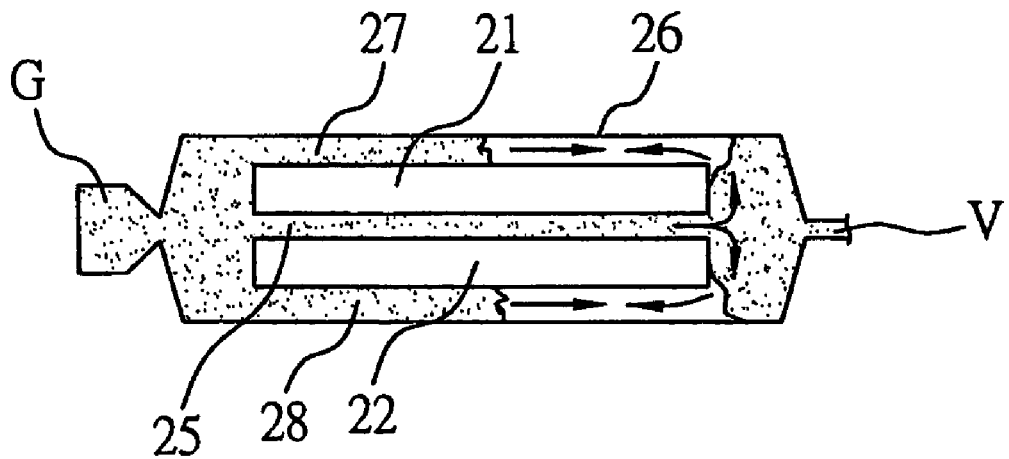
FIGS. 3A and 3B (PRIOR ART) are cross-sectional views showing mold flow situations in a molding process for the semiconductor package of FIG. 2B taken along line 3-3.
Figure 3B:
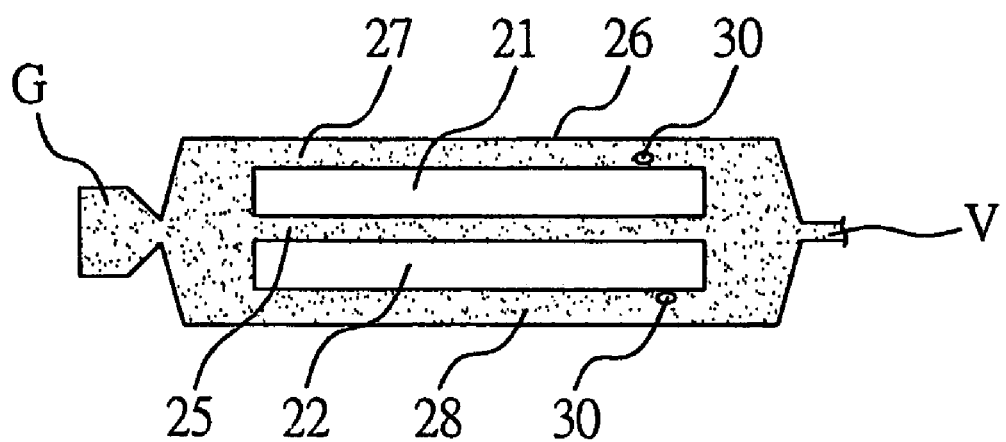
Figure 4:
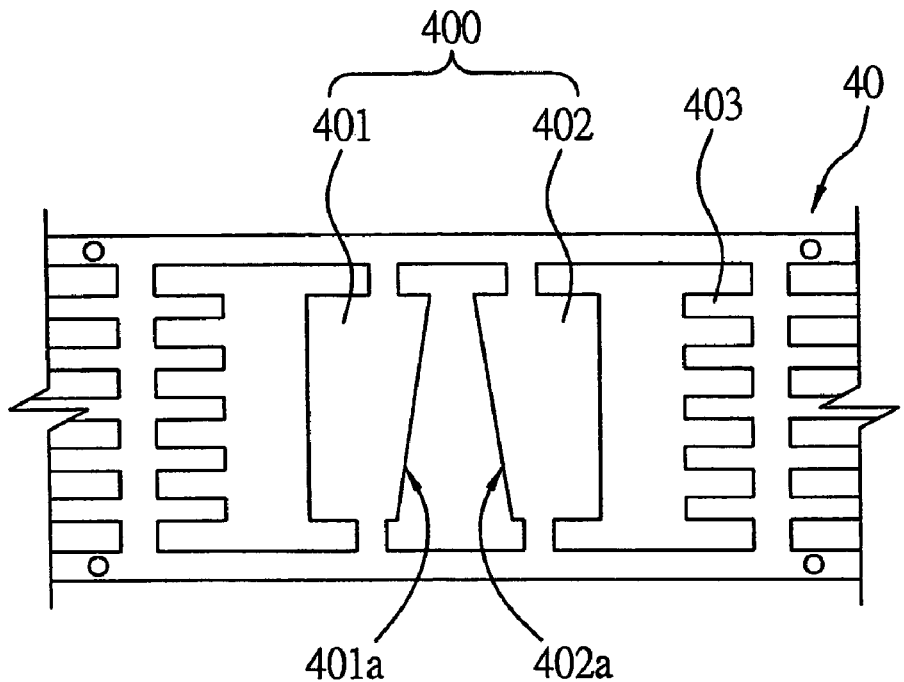
FIG. 4 is a top view of a lead frame structure according to the present invention.

FIG. 4 is a top view of a lead frame structure 40 according to the present invention. The lead frame structure 40 (hereinafter also referred to as "lead frame 40") comprises a die pad 400 and a plurality of leads 403 positioned around the die pad 400. The die pad 400 comprises a first mounting portion 401 and a second mounting portion 402 separated from the first mounting portion 401 by a gap. The first mounting portion 401 is formed with a blocking surface 401a bordering the gap, and the second mounting portion 402 is also formed with a blocking surface 402a bordering the gap, wherein the blocking surface 401a corresponds to and is opposite to the blocking surface 402a, so as to allow a flow rate of an encapsulating resin flowing through the gap to be reduced by means of the blocking surfaces 401a, 402a during a molding process where the encapsulating resin is used to form an encapsulant (not shown).

The die pad 400 is a separated die pad, and comprises the first mounting portion 401 and the second mounting portion 402. The die pad 400 has a top surface and a bottom surface, for allowing at least two semiconductor chips to be mounted to both the first and second mounting portions 401, 402 and on the top and bottom surfaces of the die pad 400 respectively. The blocking surfaces 401a, 402a of the first and second mounting portions 401, 402 as well as the semiconductor chips mounted to the die pad 400 border the gap between the first and second mounting portions 401, 402. In this embodiment, the blocking surfaces 401a, 402a are shaped as slanted surfaces to taper the gap between the first and second mounting portions 401, 402. The tapered gap between the first and second mounting portions 401, 402 reduces the flow rate of the encapsulating resin flowing therethrough during the molding process. In other words, the tapered gap formed by the blocking surfaces 401a, 402a leads to a blocking effect on the flow of the encapsulating resin in a manner that a portion of the encapsulating resin flowing into the gap between the first and second mounting portions 401, 402 has a reduced difference in flow rate from another portion of the encapsulating resin flowing into a gap between the semiconductor chips and an encapsulation mold used in the molding process, so as to allow different portions of the encapsulating resin to have substantially the same flow rate. This advantageous feature eliminates the problems such as deformation of bonding wires, short circuit between adjacent bonding wires and void formation as those encountered in the prior art.

The separated die pad of the present invention is suitable for use in a dual die thin small outline package (DDTSOP) and a dual die very thin small outline package (DDVSOP).

Figure 5:
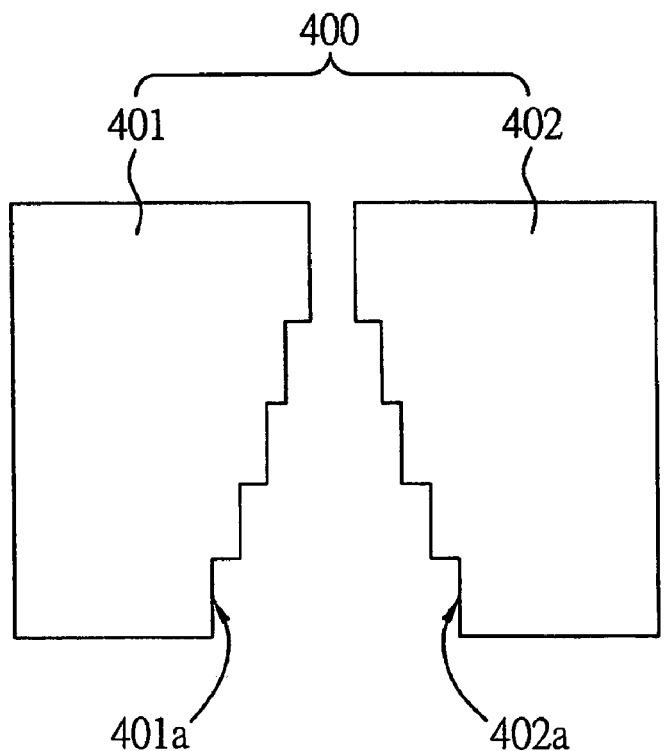
FIGS. 5, 6 and 7 are top views of a separated die pad of the lead frame structure according to different embodiments of the present invention.
Figure 6:
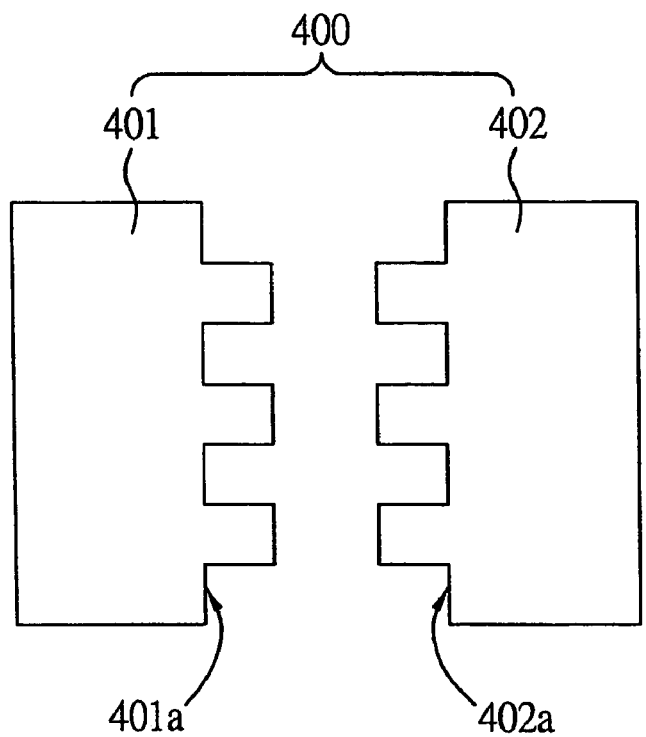
Figure 7:
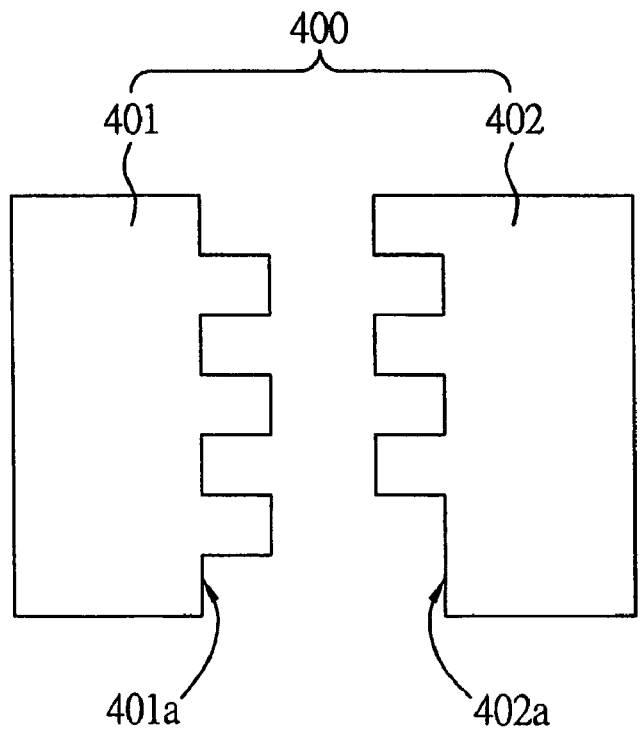

FIGS. 5, 6 and 7 are top views of the separated die pad 400 according to different embodiments of the present invention. In FIG. 5, the blocking surfaces 401a, 402a of the first and second mounting portions 401, 402 are shaped as stepped surfaces that taper the gap between the first and second mounting portions 401, 402. In FIG. 6, each of the blocking surfaces 401a, 402a of the first and second mounting portions 401, 402 is formed with a plurality of concave and convex portions, which are arranged in a manner that the concave portions of the blocking surface 401a correspond to the concave portions of the blocking surface 402a, and the convex portions of the blocking surface 401a correspond to the convex portions of the blocking surface 402a. In FIG. 7, each of the blocking surfaces 401a, 402a of the first and second mounting portions 401, 402 is formed with a plurality of concave and convex portions, which are arranged in a manner that the concave portions of the blocking surface 401a correspond to the convex portions of the blocking surface 402a, and the convex portions of the blocking surface 401a correspond to the concave portions of the blocking surface 402a. It should be noted that, the blocking surfaces 401a, 402a of the first and second mounting portions 401, 402 are not limited to the above structures but can be otherwise designed or structured to produce the blocking effect on the flow of the encapsulating resin.

Figure 8:
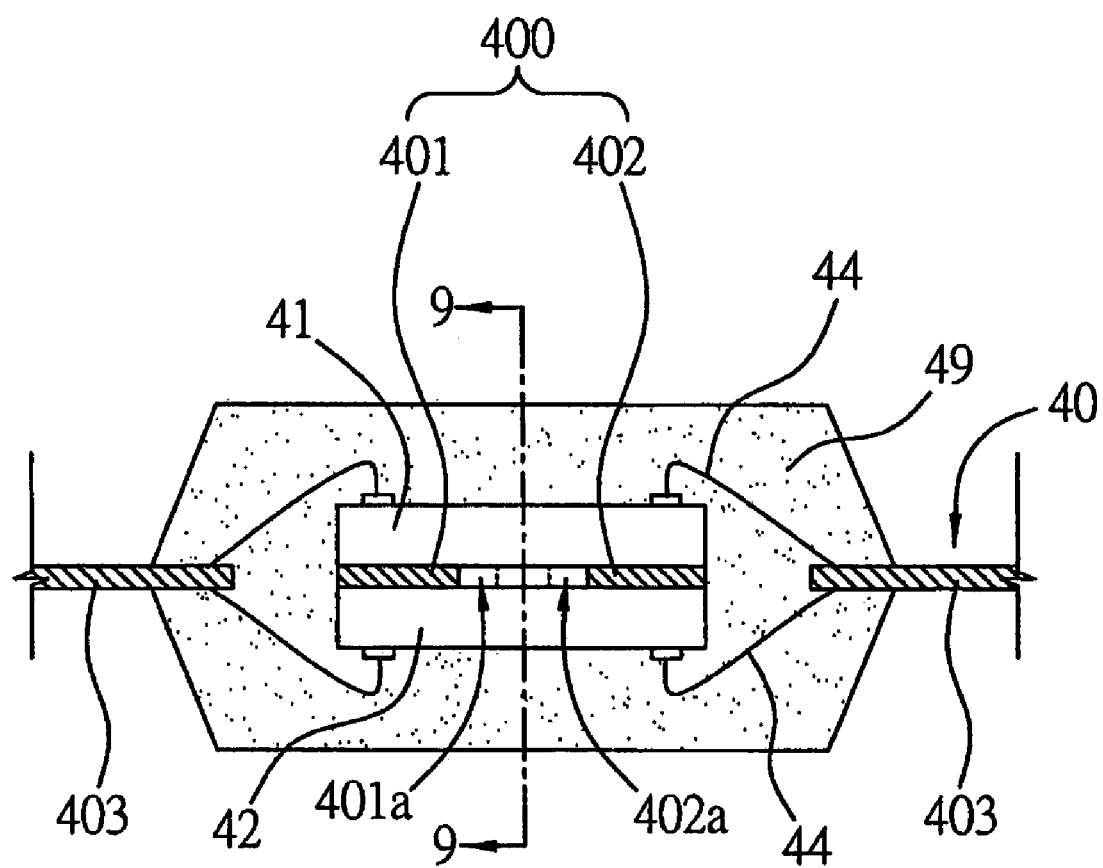
FIG. 8 is a cross-sectional view of a semiconductor package integrated with the lead frame structure shown in FIG. 4.

FIG. 8 is a cross-sectional view of a semiconductor package integrated with the lead frame structure shown in FIG. 4. The semiconductor package comprises: a lead frame 40 comprising a separated die pad 400 and a plurality of leads 403 positioned around the die pad 400, wherein the die pad 400 comprises a first mounting portion 401 and a second mounting portion 402 separated from the first mounting portion 402 by a gap; a first chip 41 and a second chip 42, the first chip 41 being mounted to both the first and second mounting portions 401, 402 and on a top surface of the die pad 400, and the second chip 42 being mounted to both the first and second mounting portions 401, 402 and on a bottom surface of the die pad 400, wherein the first and second chips 41, 42 are electrically connected to the leads 403 by bonding wires 44; and an encapsulant 49 for encapsulating the die pad 400, the first chip 41, the second chip 42, and a portion of the leads 403; wherein each of the first and second mounting portions 401, 402 has a blocking surface 401a, 402a bordering the gap between the first and second mounting portions 401, 402, and the blocking surface 401 a of the first mounting portion 401 corresponds to and is opposite to the blocking-surface 402a of the second mounting portion 402, such that an encapsulating resin for forming the encapsulant 49 when flowing into the gap can be reduced in flow rate by means of the blocking surfaces 401a, 402a.

Figure 9A:
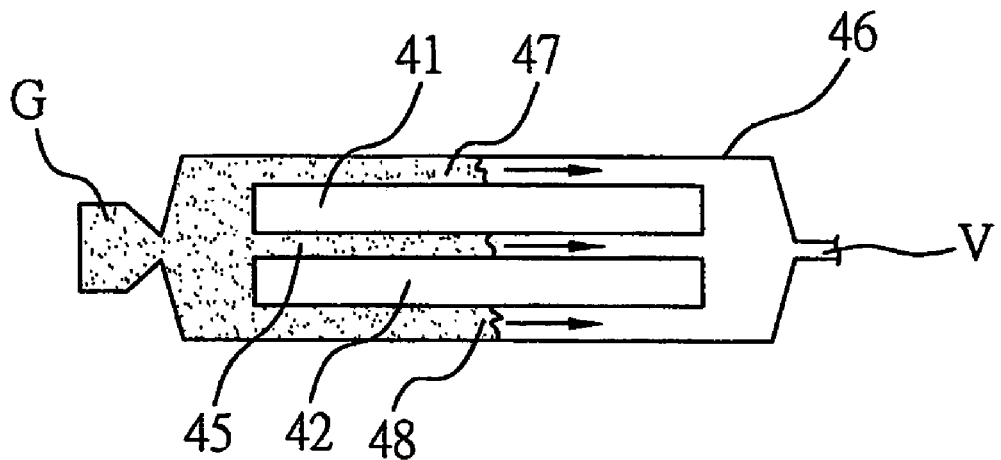
FIGS. 9A and 9B are cross-sectional views showing mold flow situations in a molding process for the semiconductor package of FIG. 8 taken along line 9-9.
Figure 9B:
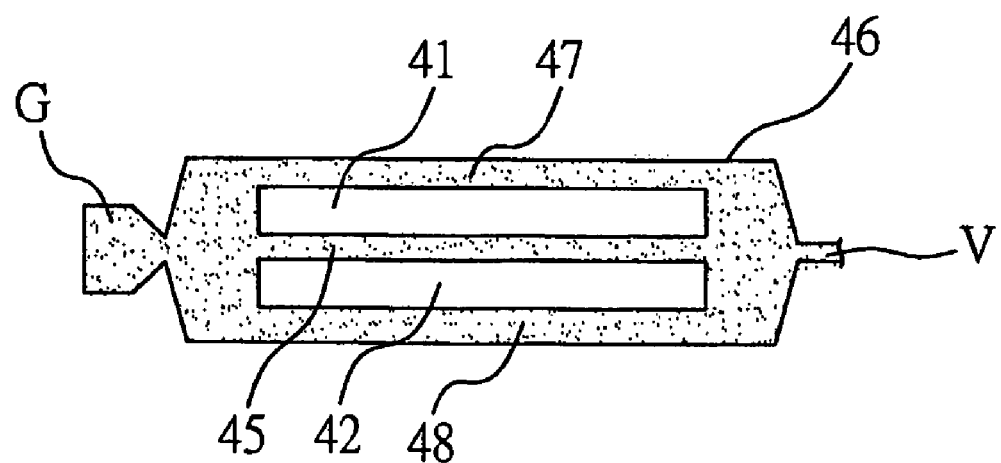

FIGS. 9A and 9B are cross-sectional views showing mold flow situations in a molding process for the semiconductor package of FIG. 8. As shown in the drawings, during the molding process, the encapsulating resin injected via a gate G into an encapsulation mold 46 flows at the same rate in all of the gap 45 between the semiconductor chips 41, 42 and gaps 47, 48 between the semiconductor chips 41, 42 and the encapsulation mold 46 to smoothly perform the molding process. As such, a vent V located at an end of the encapsulation mold 46 is not blocked by the encapsulating resin, and air in the encapsulation mold 46 can be expelled via the vent V but not trapped in the fabricated semiconductor package, thereby avoiding the occurrence of a popcorn effect.

Therefore, the lead frame structure and the semiconductor package integrated with the lead frame structure of the present invention use a separated die pad comprising a first mounting portion and a second mounting portion that are separated by a gap, wherein the first and second mounting portions are formed with corresponding blocking surfaces bordering the gap. During a molding process for encapsulating at least two semiconductor chips mounted to both the first mounting portion and the second mounting portion and on opposite surfaces of the die pad, a flow rate of an encapsulating resin flowing through the gap can be reduced by means of the blocking surfaces, so as to allow the flow rates of different portions of the encapsulating resin, which respectively flow in an upper region above the die pad, in the gap between the first and second mounting portions and in a lower region below the die pad, to be substantially equal to each other, thereby protecting the bonding wires from being deformed to cause short circuit and avoiding formation of voids.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A lead frame structure comprising:
    a die pad comprising a first mounting portion and a second mounting portion separated from the first mounting portion by a gap, for allowing at least one semiconductor chip to be attached to the first and second mounting portions; and
    a plurality of leads formed around the die pad;
    wherein each of the first and second mounting portions has a blocking surface comprised of a plurality of stepped surfaces to taper the gap bordering the gap, and the blocking surface of the first mounting portion corresponds to the blocking surface of the second mounting portion, so as to allow a flow rate of an encapsulating resin flowing through the gap during molding to be reduced by the blocking surfaces.

2. The lead frame structure of claim 1, wherein each of the blocking surfaces comprise stepped surfaces that taper the gap.

3. The lead frame structure of claim 1, wherein each of the blocking surfaces of the first and second mounting portions comprises a plurality of concave and convex portions, wherein the concave portions of the blocking surface of the first mounting portion correspond to the concave portions of the blocking surface of the second mounting portion, and the convex portions of the blocking surface of the first mounting portion correspond to the convex portions of the blocking surface of the second mounting portion.

4. The lead frame structure of claim 1, wherein each of the blocking surfaces of the first and second mounting portions comprises a plurality of concave and convex portions, wherein the concave portions of the blocking surface of the first mounting portion correspond to the convex portions of the blocking surface of the second mounting portion, and the convex portion of the blocking surface of the first mounting portion correspond to the concave portions of the blocking surface of the second mounting portion.

5. A semiconductor package integrated with a lead frame structure, comprising:
    a lead frame comprising a separated die pad and a plurality of leads formed around the die pad, the die pad comprising a first mounting portion and a second mounting portion separated from the first mounting portion by a gap, wherein each of the first and second mounting portions has a blocking surface comprised of a plurality of stepped surfaces to taper the gap bordering the gap, and the blocking surface of the first mounting portion corresponds to the blocking surface of the second mounting portion;

a first chip and a second chip, the first chip being mounted to the first and second mounting portions and on a top surface of the lead frame, and the second chip being mounted to the first and second mounting portions and on a bottom surface of the lead frame, wherein the first and second chips are electrically connected to the leads via bonding wires; and an encapsulant formed of an encapsulating resin, for encapsulating he die pad, the first chip, the second chip, and a portion of the leads, wherein a flow rate of the encapsulating resin flowing through the gap during formation of the encapsulant is reduced by the blocking surfaces.

6. The semiconductor package of claim 5, wherein the blocking surfaces comprise stepped surfaces that taper the gap.

7. The semiconductor package of claim 5, wherein each of the blocking surfaces of the first and second mounting portions comprises a plurality of concave and convex portions, wherein the concave portions of the blocking surface of the first mounting portion correspond to the concave portions of the blocking surface of the second mounting portion, and the convex portions of the blocking surface of the first mounting portion correspond to the convex portions of the blocking surface of the second mounting portion.

8. The semiconductor package of claim 5, wherein each of the blocking surfaces of the first and second mounting portions comprises a plurality of concave and convex portions, wherein the concave portions of the blocking surface of the first mounting portion correspond to the convex portions of the blocking surface of the second mounting portion, and the convex portions of the blocking surface of the first mounting portion correspond to the concave portions of the blocking surface of the second mounting portion.

* * * * *